United States Patent
Voiron et al.

(10) Patent No.: US 12,371,808 B2
(45) Date of Patent: Jul. 29, 2025

(54) METHOD FOR FORMING PRODUCT STRUCTURE HAVING POROUS REGIONS AND LATERAL ENCAPSULATION

(71) Applicants: Murata Manufacturing Co., Ltd., Nagaokakyo (JP); COMMISSARIAT A L'ENERGIE ATOMIQUE ET AUX ENERGIES ALTERNATIVES, Paris (FR)

(72) Inventors: Frédéric Voiron, Barraux (FR); Brigitte Soulier, Grenoble (FR); Guy Parat, Grenoble (FR)

(73) Assignees: MURATA MANUFACTURING CO., LTD., Nagaokakyo (JP); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 867 days.

(21) Appl. No.: 17/370,246

(22) Filed: Jul. 8, 2021

(65) Prior Publication Data

US 2021/0332492 A1  Oct. 28, 2021

Related U.S. Application Data

(63) Continuation of application No. PCT/EP2020/050295, filed on Jan. 8, 2020.

(30) Foreign Application Priority Data

Jan. 8, 2019 (EP) .................... 19305021

(51) Int. Cl.
C25D 11/04 (2006.01)
C25D 11/02 (2006.01)
(Continued)

(52) U.S. Cl.
CPC .......... *C25D 11/045* (2013.01); *C25D 11/022* (2013.01); *H01L 23/5223* (2013.01);
(Continued)

(58) Field of Classification Search
None
See application file for complete search history.

(56) References Cited

U.S. PATENT DOCUMENTS 3,864,217 A  2/1975  Takahata et al.
8,901,711 B1  12/2014  Yang et al.
(Continued)

FOREIGN PATENT DOCUMENTS

WO  2015063420 A1  5/2015

OTHER PUBLICATIONS

International Search Report issued for PCT/EP2020/050295, date of mailing Aug. 7, 2020.
(Continued)

*Primary Examiner* — Michael P. Rodriguez
(74) *Attorney, Agent, or Firm* — ArentFox Schiff LLP (57) ABSTRACT

A structure that includes: an insulating layer; a first metal layer above a first portion of the insulating layer; a first porous region of anodic oxide, above and in contact with the first metal layer; and a second porous region of anodic oxide, surrounding the first porous region, in contact with a second portion of the insulating layer adjacent to the first portion of the insulating layer, and in contact with the first metal layer, the second porous region forming an insulating region.

16 Claims, 11 Drawing Sheets

(51) Int. Cl.
*H01L 23/522* (2006.01)
*H10D 1/00* (2025.01)
*H10D 1/68* (2025.01)

(52) U.S. Cl.
CPC ............. *H10D 1/042* (2025.01); *H10D 1/696* (2025.01); *H10D 1/716* (2025.01)

(56) References Cited

U.S. PATENT DOCUMENTS

2002/0105086 A1* 8/2002 Yoshie ............. H01L 21/02282
257/762
2014/0268491 A1 9/2014 Katkar et al.
2016/0268144 A1* 9/2016 Voiron ................... H01L 28/90

OTHER PUBLICATIONS

Written Opinion of the International Searching Authority issued for PCT/EP2020/050295, date of mailing Aug. 7, 2020.
European Search Report issued for EP Application No. 19 30 5021, dated Jun. 26, 2019.
Banerjee, Parag et al.; "Nanotubular metal-insulator-metal capacitor arrays for energy storage"; Nature Nanotechnology, vol. 4, No. 5, May 2009, pp. 292-296.

* cited by examiner

METHOD FOR FORMING PRODUCT STRUCTURE HAVING POROUS REGIONS AND LATERAL ENCAPSULATION

CROSS REFERENCE TO RELATED APPLICATIONS

The present application is a continuation of International application No. PCT/EP2020/050295, filed Jan. 8, 2020, which claims priority to European Patent Application No. 19305021.8, filed Jan. 8, 2019, the entire contents of each of which are incorporated herein by reference.

FIELD OF THE INVENTION

The present invention relates to the field of integration and, more particularly, to electronic products, related semiconductor products, and their methods of manufacture.

The present invention more precisely relates to electronic components comprising porous regions.

BACKGROUND OF THE INVENTION

Silicon passive integration technologies are nowadays accessible for industrial design. For example, the PICS technology developed by Murata Integrated Passive Solutions allows integrating high density capacitive components into a silicon substrate. According to this technology, tens or even hundreds of passive components can be efficiently integrated into a silicon die.

In their work entitled "Nanotubular metal-insulator-metal capacitor arrays for energy storage" (published in Natural technology, May 2009), P. Banerjee et al. describe a metal-insulator-metal (MIM) structure formed in a porous anodic material, such as porous anodic alumina (PAA) for example. The successive layers of metal, insulator, and then metal follow the contours of the porous material resulting in the MIM structure being embedded inside the pores of the porous material. Banerjee's PAA embedded structure however suffers from high Equivalent Series Resistance (ESR) and limited capacitance density due to the PAA thickness that can be deposited by Atomic Layer Deposition (ALD).

A structure by F. Voiron et al. that improves Banerjee's ESR and capacitance is described in international application publication WO 2015/063420 A1. Voiron's structure results in highly integrated capacitance that may be used in a variety of applications. In this structure the bottoms of the pores are opened and the lower metal layer of the MIM structure contacts a conductive layer that underlies the porous region, providing electrical contact and reducing ESR.

Generally, PAA embedded structures as described above result from embedding a structure (e.g., a MIM capacitive stack) inside a porous region above a substrate, such as a silicon wafer. Typically, the porous region results from anodizing a thin layer of metal, such as aluminum, deposited above the substrate. The anodization converts the aluminum layer into porous anodic alumina. Typically, the porous region is formed with any shape (as viewed from the top) and extends across the alumina layer in a direction perpendicular to the wafer surface.

There exists a need for components including multiple capacitors each having specific properties. More precisely, it is desirable to have electrically insulated adjacent capacitors arranged on a same substrate, which may have different capacitance values so that they can be used for different applications. By way of example, capacitive arrays comprising multiple different capacitors may be used to decouple various voltage domains. To achieve this, it is necessary to electrically insulate the top and bottom electrodes of adjacent capacitors.

Figure 1:
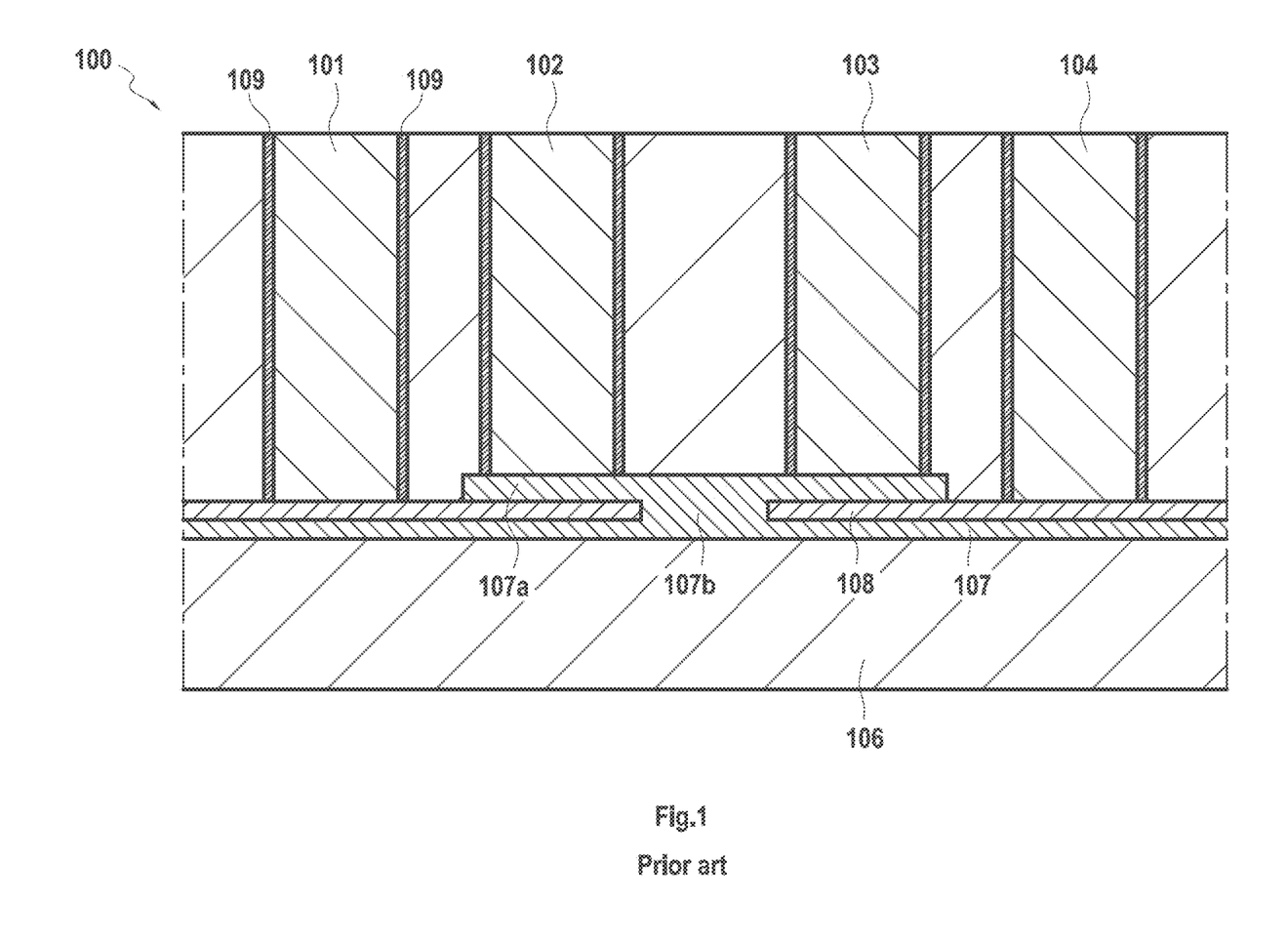
FIG. 1, already described, shows a cross-section of a structure according to the prior art.

Document WO 2015/063420 A1 discloses a solution for producing a plurality of different capacitors (at least in terms of capacitance) on a same substrate. This solution is shown in FIG. 1 which is a cross-sectional view of an example structure 100. The structure 100 comprises capacitors 101, 102, 103, and 104 fabricated using the process described in WO 2015/063420 A1. In other words, the capacitors 101, 102, 103 and 103 are fabricated within porous structures obtained by anodization (or anodic oxidation) of a metal layer 105 (not shown). Forming these capacitors implies filling the pores of a porous region with a metal-insulator-metal (MIM) structure.

The capacitors 101, 102, 103 and 104 are formed above a substrate 106 on which an insulating region 107 is formed. A conductive electrode forming a barrier layer 108 is deposited on a portion of the insulating region 107, and the capacitors 101 and 104 extend in the metal layer 105 until reaching the barrier layer 108. Capacitors 102 and 103 are not in contact with the metal layer 105 because a portion 107a of the insulating region 107 extends above the metal layer below the capacitors 102 and 103. Additionally, the insulating region 107 comprises a trench 107b which is arranged in an opening formed in the barrier layer 108. It should be noted that to provide lateral insulation, the capacitors are surrounded by a porous region 109 which is not filled with a metal-insulator-metal and which is therefore not conductive (typically, it is porous anodic oxide).

The portions 107a and 107b of the insulating region prevent the barrier layer, which comprises a conductive material, from shorting together all the bottom electrodes of the capacitors 101 to 104.

Thus, in order to form capacitors which are not all electrically connected together (through their bottom electrodes), it is necessary to perform a first photolithography step to pattern the barrier layer 108 to form an opening for portion 107b, and a second photolithography step to pattern the portion 107b.

This solution is not satisfactory in terms of number of required steps.

Additionally, the above solution of document WO 2015/063420 A1 prevents connecting a capacitor to a component placed within substrate 106: it follows from the above that if the insulating region is not present, the bottom electrodes of all the capacitors will be electrically connected together. This solution does not allow decoupling independent voltage domains.

The present invention has been made in the light of the above problems.

SUMMARY OF THE INVENTION

The present invention provides a structure, comprising: a substrate; an insulating layer above the substrate; a first metal layer above a first portion of the insulating layer; a first porous region of anodic oxide, above and in contact with the first metal layer; and a second porous region of anodic oxide, surrounding the first porous region, in contact with a second portion of the insulating layer adjacent to the first portion of the insulating layer, and in contact with the first metal layer, the second porous region forming an insulating region.

This structure allows forming a capacitor within the first porous region, for example a metal-insulator-metal capacitor, which will be insulated laterally by the first porous region and on the bottom, if necessary, by the insulating layer.

The inventors of the present invention have observed that if the metal layer which is below the first porous region is opened above the second portion of the insulating layer, the second porous region may come into contact with the insulating layer, for example when it is formed. This leads to a lateral encapsulation of the first metal layer by the second porous region.

Therefore a simple structure is provided which allows forming independent capacitors (i.e. which are not electrically coupled together through their bottom electrodes).

The first and second porous regions may be formed by anodization of a metal layer, so that a plurality of pores is formed in each region. The material around the pores may be an oxide of this metal layer, for example a nonconductive oxide. Thus, preferably, the second porous region is non-conductive.

Also, the first metal layer may be a barrier layer used during this anodization process.

The substrate may be a silicon substrate or a substrate comprising a silicon region, electrical components, and interconnections.

The pores may be straight, eventually all having the same direction, for example the vertical direction.

Also and according to an example, surrounding may mean laterally surrounding.

According to a particular embodiment, the insulating layer comprises a third portion and a fourth portion adjacent to the third portion, the third portion and the fourth portion being spaced from the first portion and the second portion of the insulating layer, the first metal layer comprising a first portion above the first portion of the insulating layer and a second portion above the fourth portion of the insulating layer, the structure further comprising: a third porous region of anodic oxide, above and in contact with the second portion of the first metal layer; a fourth porous region of anodic oxide, surrounding the third porous region, in contact with the third portion of the insulating layer, and in contact with the second portion of the first metal layer, the fourth porous region forming an insulating region.

This particular embodiment allows forming two capacitors on each side of the opening of the insulating layer. These capacitors may be electrically independent even if metal fills the opening: the second porous region and the fourth porous region, in addition with the second and third portions of the insulating layer, ensure that capacitors are formed within the first and third porous regions, these capacitors are electrically independent.

According to a particular embodiment, the structure comprises a metal region adjacent to the second porous region or between the second porous region and the fourth porous region.

This metal region may be formed when a metal layer is deposited above the first metal layer, so that porous regions are formed in this metal layer. A patterning method may be used to obtain both the porous regions and the metal regions.

It has been observed by the inventors of the present invention that this metal region may be used as an electrical connection. For example, this metal region may be connected to an electrical component.

According to a particular embodiment, the structure comprises a first hard mask above the metal region partially overlapping at least the second portion of the insulating layer.

This first hard mask may comprise an insulating material such as silicon dioxide or nitride or polymers. Preferably, the material of the first hard mask does not anodize. Also, this hard mask allows patterning a deposited metal layer to obtain the metal region and the porous regions. This hard mask acts as a mask for an anodization process.

It should be noted that by "partially overlapping", what is meant is that there is a first sub-portion of the second portion of the insulating layer which is placed below the hard mask but a second sub-portion of the second portion of the insulating layer is not placed below the hard mask. This second sub-portion may be adjacent to the first portion of the insulating layer.

It should be noted that manufacturing the first hard mask may be performed according to the method described in European patent application 18305492.3 filed on Apr. 20, 2018, the contents of which are incorporated by reference in the present application.

According to a particular embodiment, the insulating layer comprises an opening adjacent to the second portion of the insulating layer or between the second portion of the insulating layer and the third portion of the insulating layer.

This opening of the insulating layer can be formed because the first metal layer is laterally encapsulated by the second porous region.

Also, the opening may be filled with conductive material, for example from the metal region or from another portion of the first metal layer (not connected to the one below the first porous region) so as to form an electrical connection with an element placed below the insulating layer.

According to a particular embodiment, the structure comprises a second hard mask having an opening above the first porous region, the second hard mask surrounding and being above the first hard mask.

This second hard mask may be used to delimit the porous regions which have to remain non-conductive, and the porous regions which may accommodate capacitors, for example metal-insulator-metal capacitors.

The second hard mask therefore participates in obtaining the electrical insulation around the first porous region because it participates in defining the shape of this region.

It should be noted that manufacturing the second hard mask may be performed according to the method described in European patent application 18035582.1 filed on May 11, 2018, the contents of which are incorporated by reference in the present application.

According to a particular embodiment, the structure comprises a conductive via arranged through the first portion of the first insulating layer, the first metal layer, and the first porous region.

In this embodiment, the conductive via goes through the first portion of the first insulating layer, the first metal layer, and the first porous region. The first metal layer may not be electrically connected to this conductive via, for example because it is insulated from this via because it is patterned to be in recess with respect to the via, and because non-conductive porous regions laterally encapsulate the first metal layer between the first porous region (which may comprise a metal-insulator-metal structure).

In other words, the first porous region may have an annular shape around the conductive via, which may have a structure analogous to the above mentioned metal region.

For example, the conductive via may comprise a metal-region as defined above.

According to a particular embodiment, the first porous region comprises a metal-insulator-metal structure inside its pores.

Fabrication of this metal-insulator-metal structure may be performed according to the method disclosed in document WO 2015/063420 A1.

A capacitor associated with this first porous region may then be obtained.

According to a particular embodiment, the metal-insulator-metal structure comprises a bottom metal layer in contact with the first metal layer.

According to a particular embodiment, the insulating layer comprises an additional opening below the first porous region, the additional opening being filled with metal of the first metal layer.

For example, if the first porous region comprises a metal-insulator-metal structure inside its pores having a bottom layer in contact with the first metal layer, then this additional opening may an electrical connection between this bottom layer (which is an electrode of a capacitor) and an electrical component placed below the insulating layer.

According to a particular embodiment, the substrate comprises at least one component electrically connected to either the first metal layer through an additional opening of the insulating layer or to a metal region through an opening of the insulating layer.

This component may be a passive electrical component (resistor, etc.) or an active electrical component (transistor, etc.) formed in the substrate prior to forming the porous regions.

According to a particular embodiment, the at least one component is connected to said first metal layer or to said metal region through an interconnection network and a pad.

This interconnection network may form the portion of an integrated circuit known to the skilled person as a "Back End Of Line (BEOL)" portion.

The pad may be a portion of a layer of metallization of the interconnection network.

The invention also provides a method of fabricating a structure, comprising: forming an insulating layer above a substrate; depositing a first metal layer above a first portion of the insulating layer; forming a first porous region of anodic oxide, above and in contact with the first metal layer; and forming a second porous region of anodic oxide, surrounding the first porous region, in contact with a second portion of the insulating layer adjacent to the first portion of the insulating layer, and in contact with the first metal layer, the second porous region forming an insulating region.

This method may be used to fabricate every embodiment of the structure as defined above.

According to a particular embodiment, the method comprises depositing a second metal layer above the first metal layer and anodizing the second metal layer to obtain the first and second porous regions.

According to a particular embodiment, the method comprises depositing a first hard mask above the second metal layer before anodizing the second metal layer to obtain a metal region adjacent to the second porous region, the first hard mask partially overlapping at least the second portion of the insulating layer.

According to a particular embodiment, the method comprises depositing a second hard mask having an opening above and surrounding the first hard mask, the second hard mask having an opening above the first porous region.

It should be noted that the above defined electronic product may be produced using any particular embodiment of the method as defined above.

BRIEF DESCRIPTION OF THE DRAWINGS

Further features and advantages of the present invention will become apparent from the following description of certain embodiments thereof, given by way of illustration only, not limitation, with reference to the accompanying drawings in which.

DETAILED DESCRIPTION OF EXAMPLE EMBODIMENTS

The steps for fabricating a structure in which capacitors are formed according to an embodiment will be described hereinafter.

This embodiment addresses the existing deficiencies of the prior art relating to the complexity of forming two capacitors which are not electrically coupled together, in porous regions.

Figure 2:
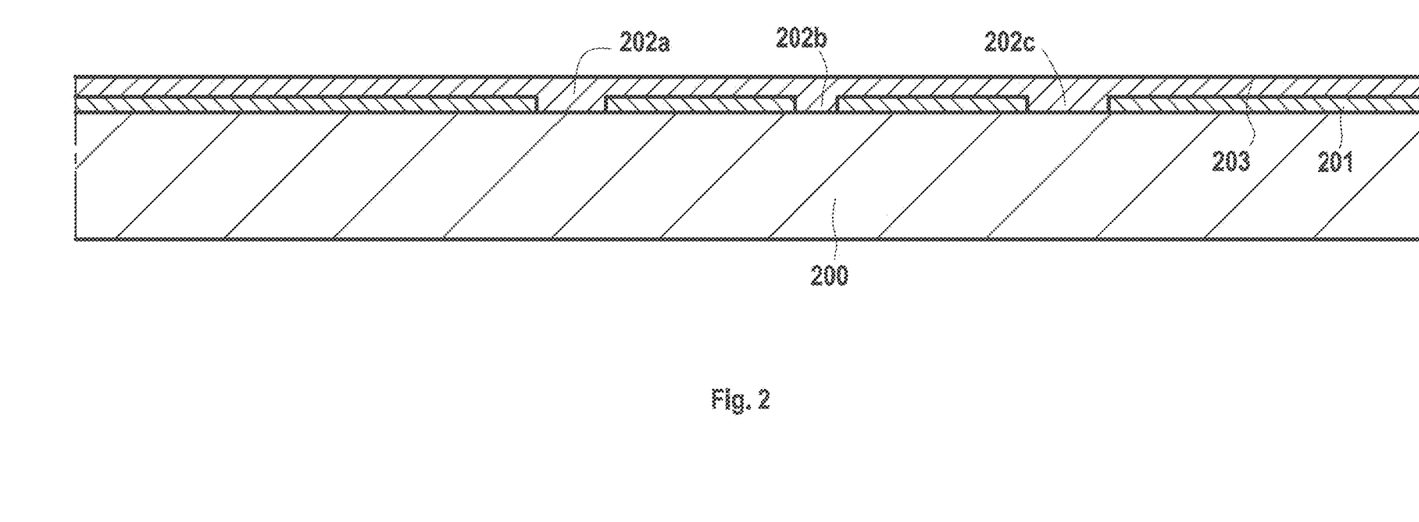
FIGS. 2 to 10 show the steps of the method for fabricating a structure comprising capacitors according to an example.

FIG. 2 is a side view of a structure comprising a semiconductor substrate 200. This semiconductor substrate may comprise a silicon portion on which electrical components such as transistors, diodes, and resistors, have been formed. Above these components, an interconnection network has been formed, and this interconnection network comprises a plurality of metallization layers connected together using vias in a manner which is known in itself. The top portion of the semiconductor substrate may comprise the top metallization layer of the substrate, and pads (electrical connection pads) to form contact with components placed above the substrate. By way of example, the pads may be metal regions comprising aluminum or copper, optionally, a barrier layer comprising titanium or titanium nitride, and a layer of solderable metal (for example Nickel) may be formed on these metal regions.

For example, the substrate 200 can be a wafer.

Above the substrate 200, an insulating layer 201 has been formed by deposition of an insulating material. The insulating layer is patterned, for example by photolithography. By patterning this layer, openings 202a, 202b, and 202c are formed and these openings are through holes that lead to the substrate 200 and preferably onto pads of the substrate or metal regions (for example of a metallization layer). The openings 202a to 202c may be in the shape of trenches or of holes, for example circular holes, or of any suitable shape (typically round or rectangular).

Above the insulating layer 201 and in the openings 202a to 202c, a first metal layer 203 is deposited. This metal layer is deposited in a conformal manner to fill the openings 202a to 202c. The conductive material of this metal layer may be chosen so that the metal layer acts as a barrier layer for an anodization process. This means that during a subsequent anodization step, the formation of anodic oxide in the first metal layer is slow and, more precisely, slower that the formation of anodic oxide in the subsequently deposited second metal layer. This may result from the formation of a barrier oxide when the first metal layer is contacted by an electrolyte used during the anodization, this oxide, when reaching a given thickness for a given voltage, will block the anodic electrochemical reaction.

Additionally, a good etching selectivity between the material of the first metal layer and the material of the insulating layer is preferable: this implies that the dissolution of the first metal layer 203 is slower than the dissolution of subsequently formed anodic oxides such as aluminum oxides.

By way of example, the first metal layer 203 may comprise Titanium or tungsten or molybdenum.

Figure 3:
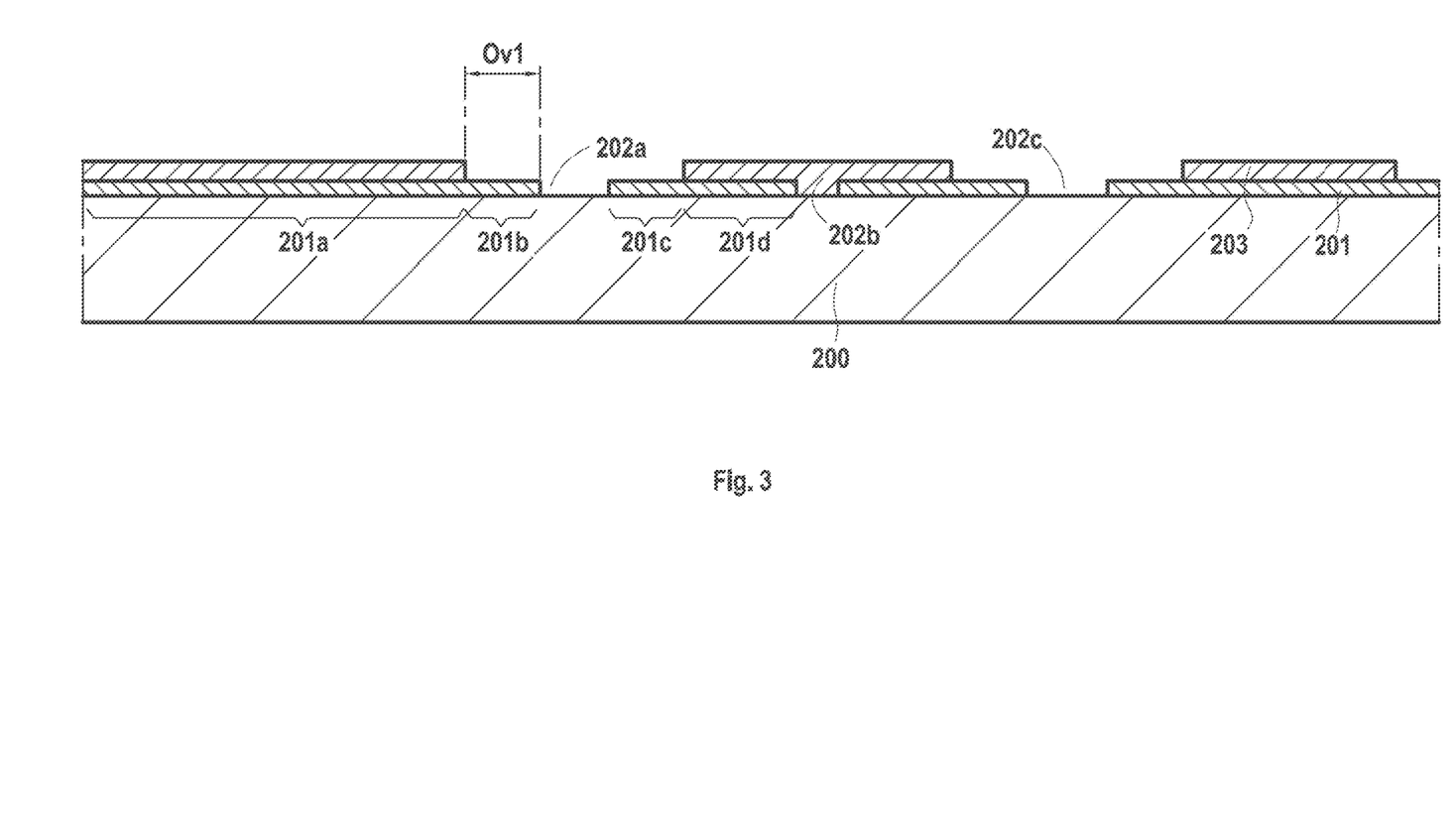

As shown on FIG. 3, the first metal layer 203 is patterned through a photolithography step. After this photolithography step, portions of the substrate 200 (or of pads or metallization layers) and portions of the insulating layer are exposed.

More precisely, around openings 202a and 202c, there are portions of the first insulating layer which are not covered by the first metal layer. Also, there remain portions of the first insulating layer which are covered by the first metal layer. On the figure, a first portion 201a of the first insulating layer is covered by the first metal layer, a second portion 201b of first insulating layer is not covered by the first metal layer. The first and second portions are adjacent and they are spaced from a third portion 201c of the first insulating layer which is not covered by the first metal layer, the third portion 201c being adjacent to a fourth portion of the first insulating layer covered by the first metal layer.

Preferably, the portions of the first insulating layer which are not covered by the first metal layer have a width Ov1 which is greater than a distance threshold having a value comprised within 1 to 30 micrometers.

In the illustrated example, opening 202b of the insulating layer is filled with the metal of the first metal layer so as to subsequently form an electrical connection.

Figure 4:
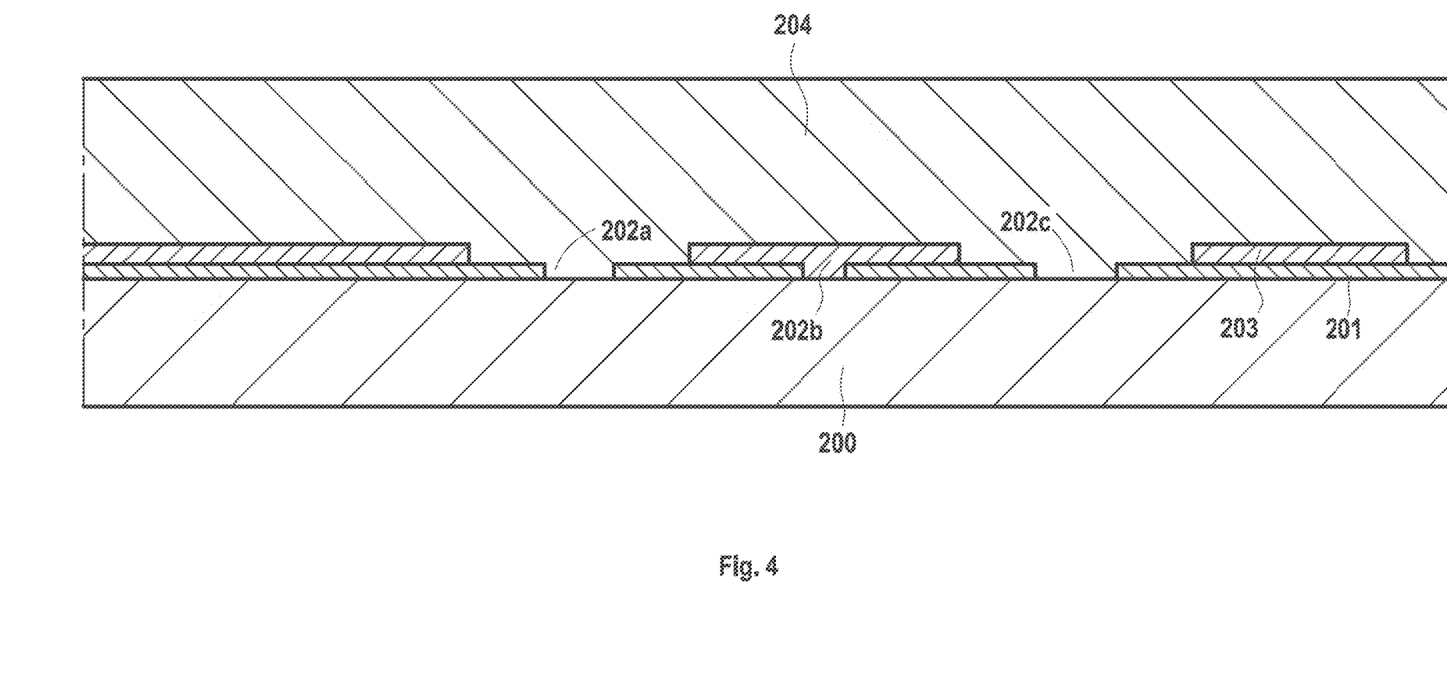

FIG. 4 shows the formation of a second metal layer 204. This second metal layer may comprise a material which can be anodized to form porous regions. Preferably, the second metal layer 204 comprises aluminum and has a thickness superior than one micrometer, for example comprised between 4 and 8 micrometers. The invention is however not limited to the use of aluminum for the second metal layer and may also use other materials like for example magnesium or tantalum, which allow forming regular porous regions (for example straight pores all having the same dimensions).

Figure 5:
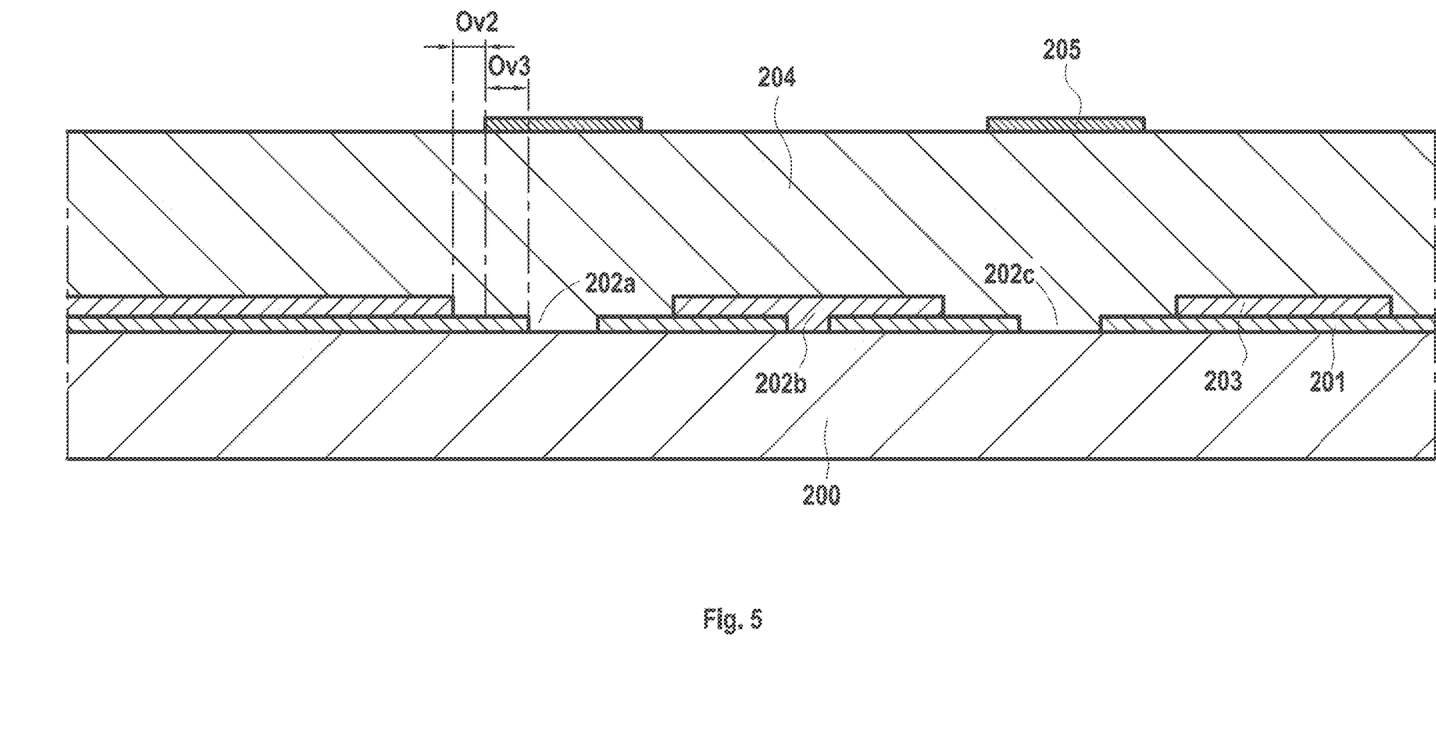

On FIG. 5, the structure of FIG. 4 has been shown after a step of forming a first hard mask 205 above the second metal layer 204. This first hard mask is patterned, for example using a photolithography step, so as to cover regions of the second metal layer 204 which should not be anodized in a subsequent step. Consequentially, the first hard mask 205 may comprise a material which does not anodize, and may comprise a material chosen among silicon dioxide, nitride, or polymers.

In the illustrated example, the first hard mask 205 is patterned so that after the subsequent anodization step, metal is present below this hard mask to form electrical connections with components placed in the substrate 200. Additionally, the first hard mask 205 is patterned so as to allow the formation of porous regions which will form insulating regions around capacitors which will be subsequently formed: in other words, later formed porous regions should be able to laterally encapsulate the first metal where needed. This may be obtained by patterning the first hard mask so that the first hard mask partially overlaps the portions of the insulating layer which are not covered by the first metal layer. The openings 202a and 202c are below the first hard mask 205.

Here, the first hard mask 205 overlaps a portion of insulating layer having a width Ov3 while a portion of width Ov2 (adjacent to the portion of the insulating layer which is below the first metal layer 203) is not overlapped by the first hard mask 205. Preferably, the widths Ov2 and Ov3 are both strictly superior to zero. It should also be noted that Ov1 is equal to the sum of Ov2 and Ov3.

Figure 6:
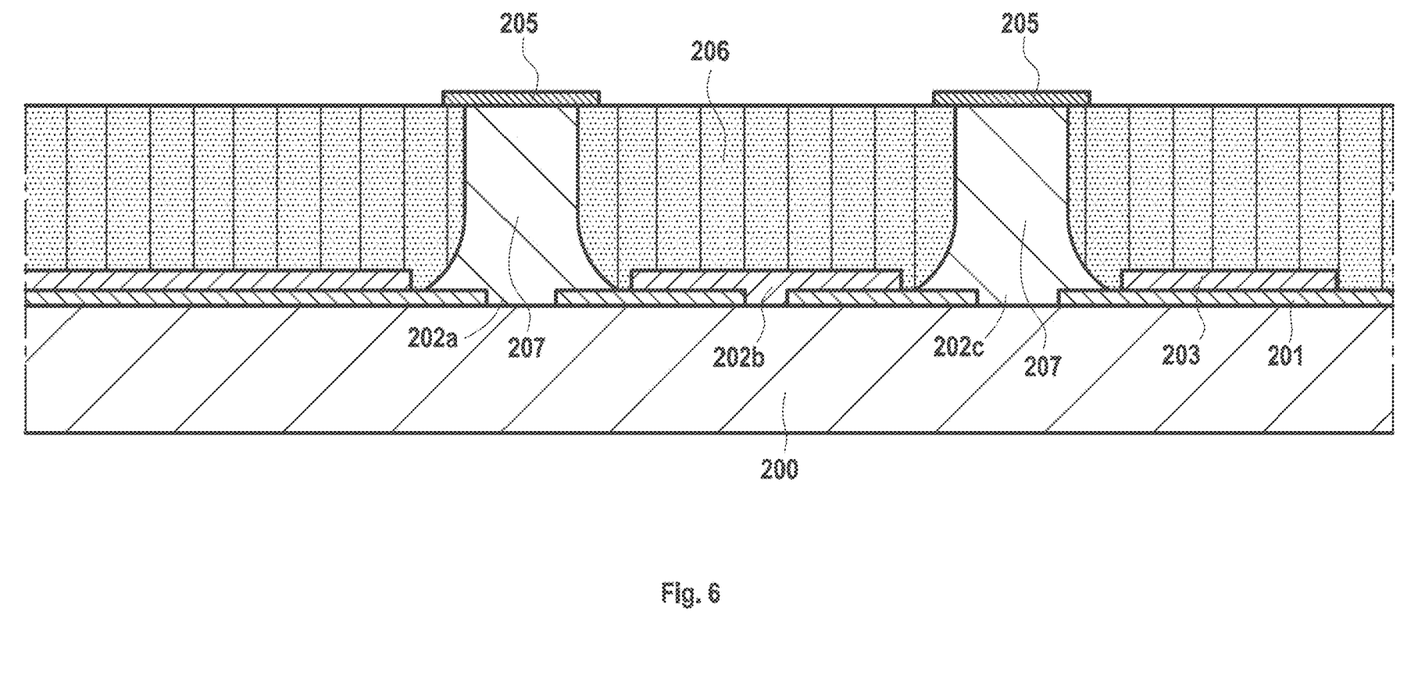

An anodization step is then performed and the obtained structure is shown on FIG. 6. Porous regions 206 are obtained after the anodization has been performed, and substantially below the first hard mask 205, metal regions 207 remain. The anodization is performed through the openings of the first hard mask 205.

This anodization is performed, preferably, until pores formed in the second metal layer reach the first metal layer. This can be controlled by detecting a drop of intensity of the anodization current used for the anodization process: this drop is detectable when pores reach the first metal layer.

At this stage, the porous regions 206 are non-conductive. These porous regions encapsulate laterally the first metal layer 203. Thus, the porous regions (or more precisely their pores) also reach the first insulating layer. This may notably be obtained through the patterning of the first hard mask 205 and the widths Ov2 and Ov3 being both strictly superior to zero, as explained in reference to FIG. 5.

In the illustrated example, the metal regions 207 are still reaching the substrate 200 in the openings 202a and 202b.

Figure 7:
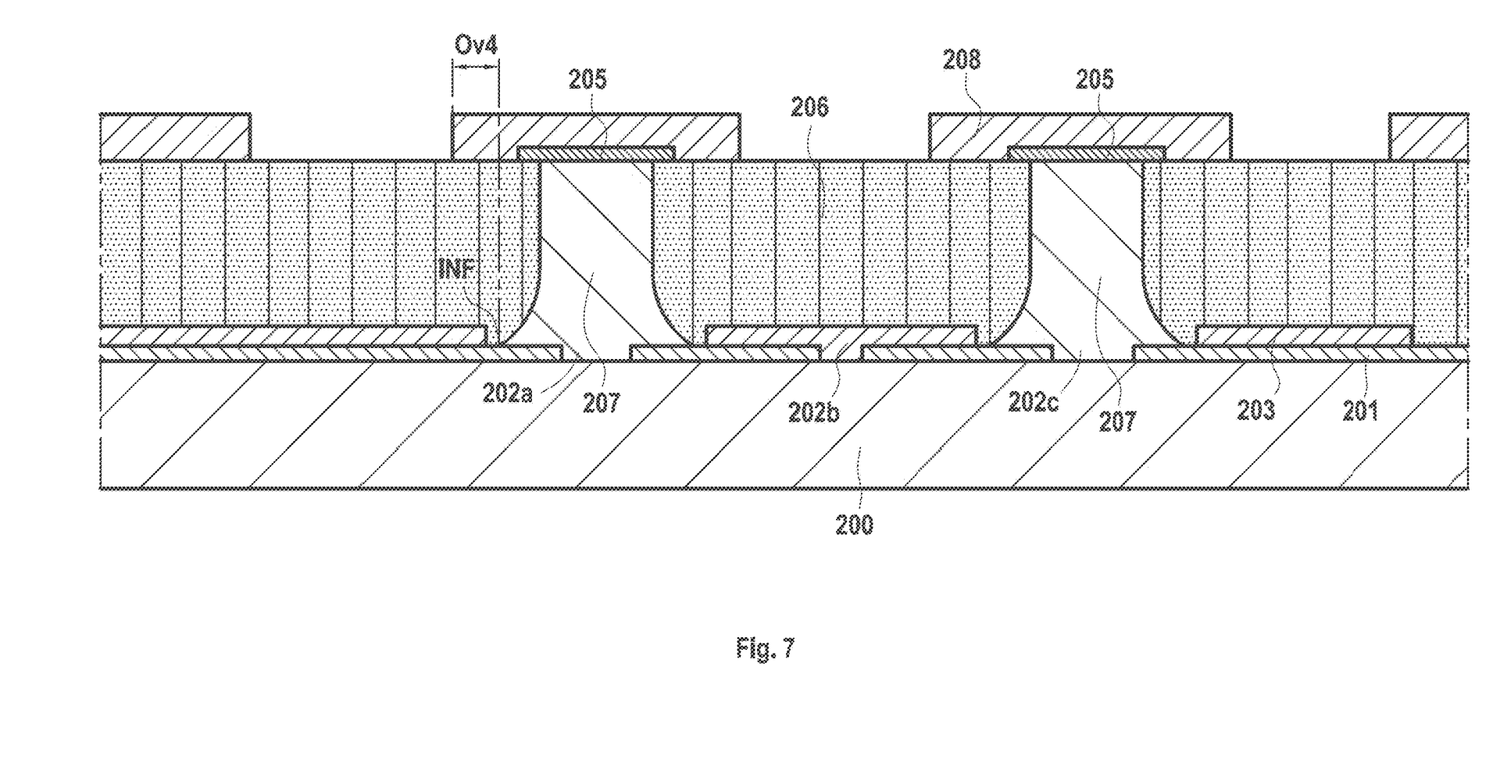

FIG. 7 shows the structure of FIG. 6 after the formation of a second hard mask 208. The second hard mask 208 is provided with openings above porous regions in which capacitors will be subsequently formed. To this end, the second hard mask 208 is patterned so as to comprise openings above the porous regions, these openings being configured so that the edges of the first metal layer (around the openings 202a and 202c) are below the second hard mask 208.

The dimensions of the openings of the second hard mask 208 may be chosen so as to ensure that a lateral insulation of the porous regions filled with capacitors is obtained. The obtained lateral insulation extends over a width Ov4 measured from an edge of a portion of the second hard mask to the closest interface INF between: the porous region 206, the metal region 207, and the insulating layer 201. The anodization can be tuned to obtain the lateral insulation. For example the anodization may comprise an observation of a variation of the anodization current which indicates that the porous region has reached the first metal layer 203. Pursuing the anodization for a duration of about 10 to 30 minutes allows forming a barrier for the anodization at the interface between the porous region 206 and the first metal layer 203: this prevents the porous region from penetrating down through the first metal layer 203. During this time, it has been observed that the porous region 206 extends laterally at the edges of the first metal layer until reaching the insulating layer 201 at the level of the interface INF. By way of example, for a first metal layer having a thickness of about 300 nanometers, the lateral insulation may be obtained by pursuing further the anodization for a duration of about 20 to 30 minutes.

This allows controlling the electrical insulation between adjacent subsequently formed capacitors.

It should be noted that the second hard mask 208 may comprise any silicon oxide, nitride or tungsten or titanium.

Figure 8:
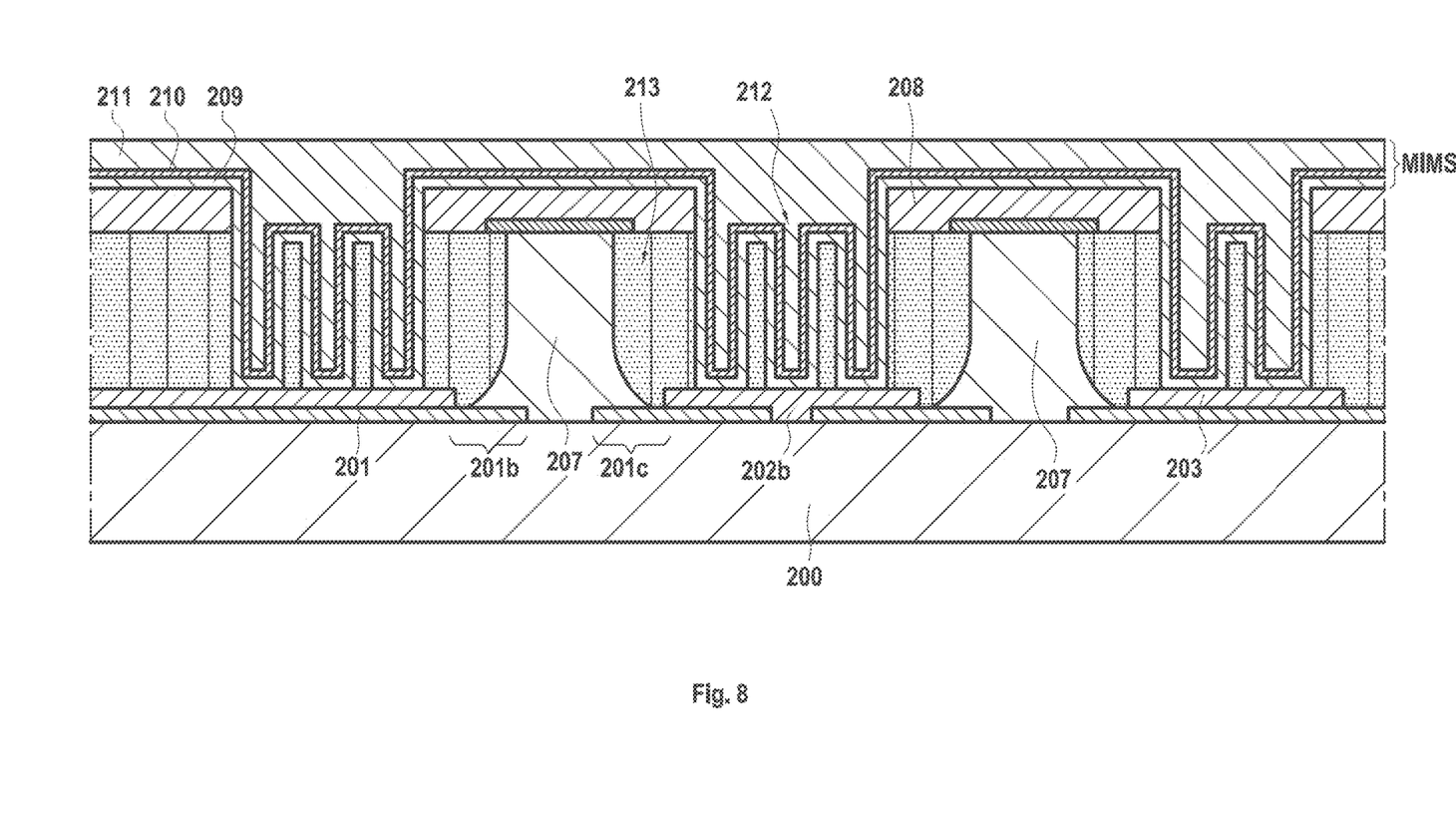

FIG. 8 shows the formation of a metal-insulator-metal structure MIMS comprising a bottom metal layer 209, a middle insulating layer 210, and a top metal layer 211 so as to form capacitors. The formation of the MIMS structure may comprise successive conformal depositions using the second hard mask 208 to delimit the porous regions which are filled with the structure MIMS. It should be noted that on FIG. 8, for the sake of simplicity, the structure has been represented as if a 2 to 3 pores were present for each subsequently formed capacitor whereas an actual structure may comprise a larger number of pores (the capacitors are, at this stage, all connected to form a single capacitor, they are not yet separated).

Also, because the second hard mask 208 was used, there are now two types of porous regions: first porous regions 212 filled with the structure MIMS, and non-conductive porous regions 213. It should be noted that portions of the non-conductive porous regions 213 are in contact with the second portion of the first insulating layer 201b and the third portion of the first insulating layer 201c described in reference to FIG. 3.

It should be noted that the first porous regions 212 filled with the structure MIMS reach the first metal layer 203 via the bottom metal layer 209. At this stage, is can be noted that the opening 202b filled with metal from the first metal layer 203 forms an electrical connection between the bottom metal layer 209 and the substrate 200 (or with a pad or a metallization layer).

Figure 9:
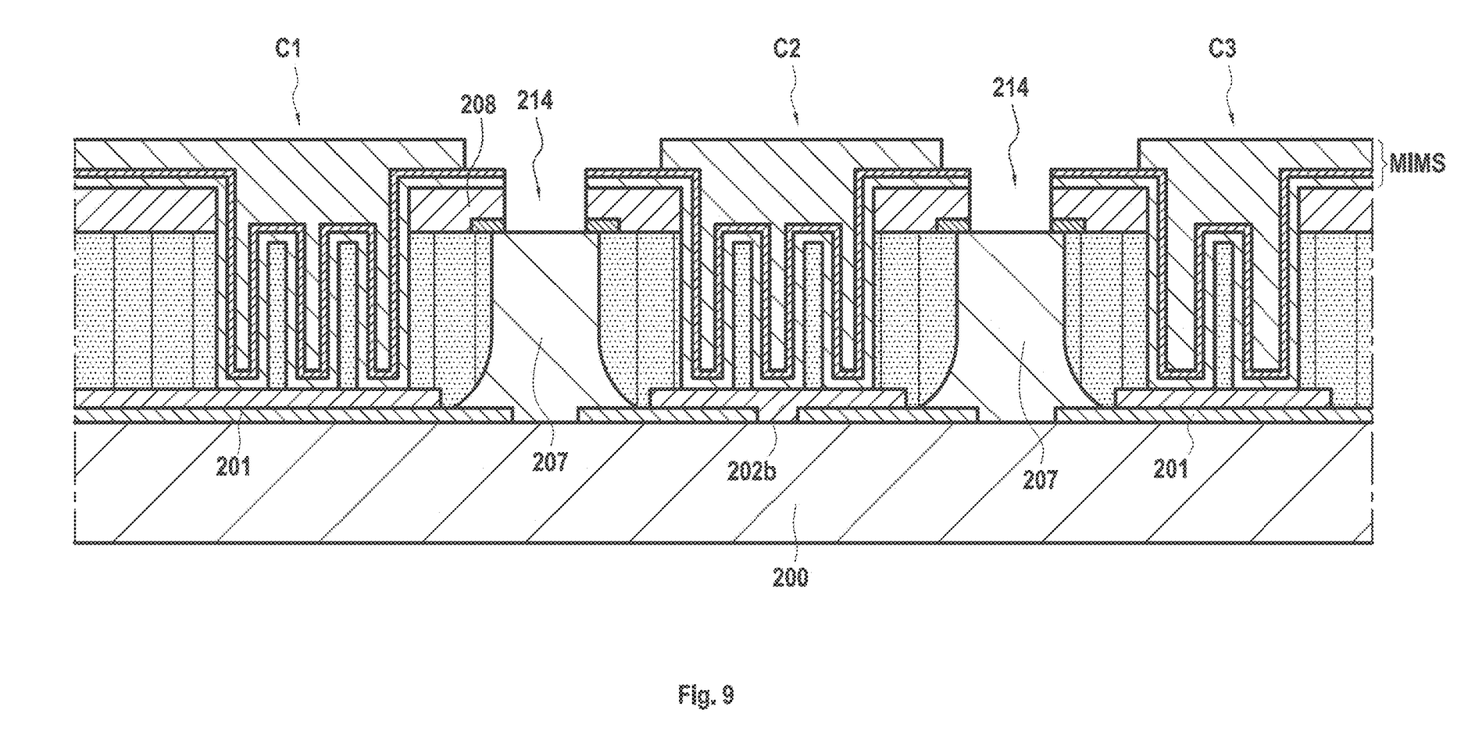

In order to form distinct capacitors, a patterning of the following conductive layers is performed: the structure MIMS, the first hard mask 205, the second hard mask 208 (FIG. 9). Three capacitors C1, C2 and C3 are obtained, and these capacitors are laterally electrically insulated from one another. Openings 214 are formed above the metal regions 207.

Figure 10:
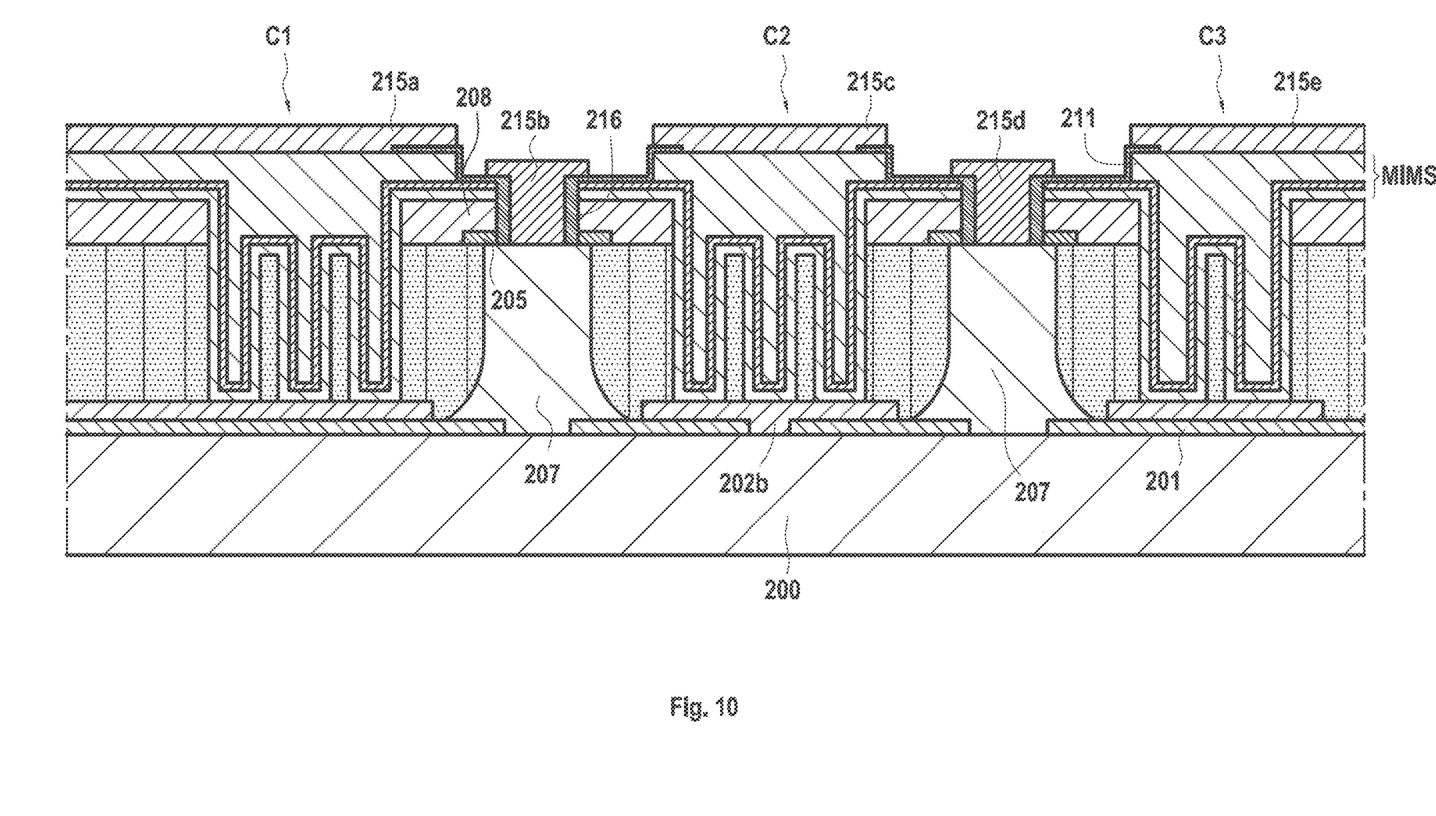

On FIG. 10, the structure of FIG. 9 has been represented with a patterned metallization layer formed so as to obtain electrical pads 215a, 215b, 215c, 215d, and 215e.

The electrical pads 215a, 215c and 215e are connected to the top electrode 211 of the structure MIMS. For capacitor C2, because the insulating layer 201 comprises an opening 202b, this capacitor is connected between a component in the substrate 200 and the top of the structure.

The electrical pads 215b and 215d are connected to the metal regions 207. Additional lateral insulation 216 is formed on the sides of the electrical pads 215b and 215d so as to avoid connecting the electrical pads 215b and 215d to the metal layers of the structure MIMS. It should be noted that the metal regions 207, with the electrical pads 215b and 215d, form vias that can connect components in the substrate to the top of the structure. These vias are laterally insulated by the porous regions.

By way of example, it is possible to form an annular capacitor which surrounds a via similar to the one formed by the metal region 207 and the pad 215b. A side view of such a structure may have an appearance similar to the capacitors C1 and C2 around the metal region 207 and the pad 215b. Different arrangements are also possible to produce an annular structure without a pad such as pad 215b: the second hard mask 208 is above a non-conductive porous region 206 but it is not etched to accommodate a pad and no via is formed.

Figure 11A:
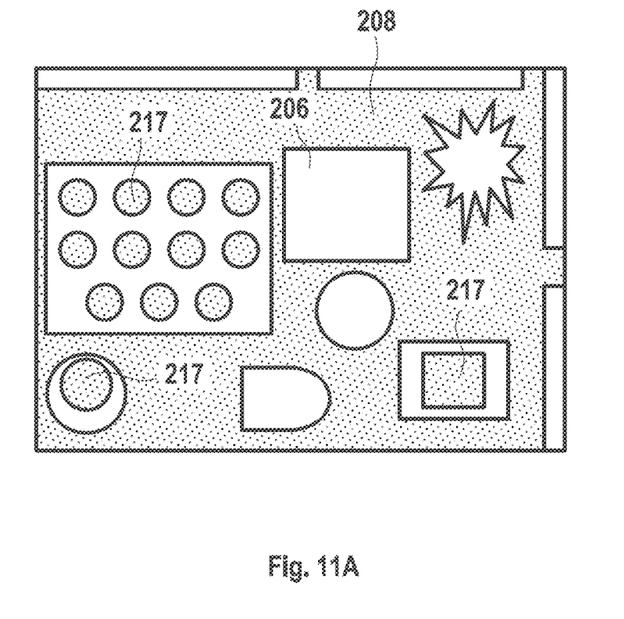
FIGS. 11A and 11B show two examples of layouts according to an example.

FIG. 11A is a top view of a structure obtained for example after the steps described in relation to FIGS. 2 to 7 have been implemented. An example layout is shown on the figure in which the dotted areas comprise the second hard mask 208 and the white areas comprise porous regions 206.

As can be seen on the figure, it will be possible to form matrixes of vias 217 or single vias 217 in the middle of capacitors which will be subsequently formed. As explained above, these vias will be electrically insulated from the conductive layers of the capacitors.

Also, it should be noted that the porous regions form insulated wells which can be of any shape. Some or all the bottom electrodes of the capacitors can be connected to components placed in an underlying substrate, through an opening in the insulating layer.

Figure 11B:
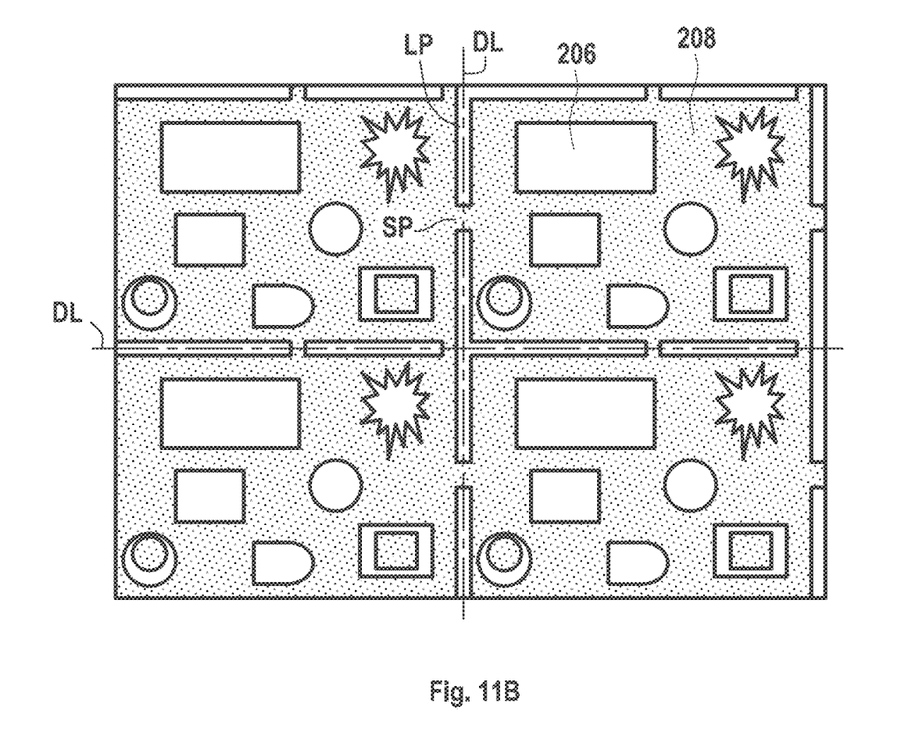

FIG. 11B shows another possible top view in which dicing lines DL are shown separating different portions of the structure. For example, the structure may be cut along these lines in a subsequent step.

In the illustrated example, the dicing lines comprise discontinuous non-conductive portions LP of porous regions 206 separated by conductive portions SP comprising metal regions from the second metal layer 204. The discontinuities SP may be used to allow the propagation of a uniform potential v from the conductive edge of the wafer to all porous structures (anodic oxide) during anodization. The portions SP therefore facilitate the uniformity of the voltage and consequently produce better anodization results.

ADDITIONAL VARIANTS

Although the present invention has been described above with reference to certain specific embodiments, it will be understood that the invention is not limited by the particularities of the specific embodiments. Numerous variations, modifications and developments may be made in the above-described embodiments within the scope of the appended claims.

The invention claimed is:

1. A structure, comprising:
   a substrate;
   an insulating layer above the substrate;
   a first metal layer above a first portion of the insulating layer;
   a first porous region of anodic oxide, above and in contact with the first metal layer; and
   a second porous region of anodic oxide, surrounding the first porous region, in contact with a second portion of the insulating layer adjacent to the first portion of the insulating layer, and in contact with the first metal layer, the second porous region forming an insulating region.

2. The structure of claim 1, wherein the insulating layer comprises a third portion and a fourth portion adjacent to the third portion, the third portion and the fourth portion being spaced from the first portion and the second portion of the insulating layer,
   the first metal layer comprises a first portion above the first portion of the insulating layer and a second portion above the fourth portion of the insulating layer, and
   the structure further comprises:
   a third porous region of anodic oxide, above and in contact with the second portion of the first metal layer; and
   a fourth porous region of anodic oxide, surrounding the third porous region, in contact with the third portion of the insulating layer, and in contact with the second portion of the first metal layer, the fourth porous region forming an insulating region.

3. The structure of claim 1, further comprising a metal region adjacent to the second porous region or between the second porous region and the fourth porous region.

4. The structure of claim 3, further comprising a first hard mask above the metal region partially overlapping at least the second portion of the insulating layer.

5. The structure of claim 1, wherein the insulating layer comprises an opening adjacent to the second portion of the insulating layer or between the second portion of the insulating layer and the third portion of the insulating layer.

6. The structure of claim 1, further comprising a second hard mask having an opening above the first porous region, the second hard mask surrounding and being above the first hard mask.

7. The structure of claim 1, further comprising a conductive via arranged through the first portion of the first insulating layer, the first metal layer, and the first porous region.

8. The structure of claim 1, wherein the first porous region comprises a metal-insulator-metal structure inside pores of the first porous region.

9. The structure of claim 8, wherein the metal-insulator-metal structure comprises a bottom metal layer in contact with the first metal layer.

10. The structure of claim 1, wherein the insulating layer comprises an additional opening below the first porous region, the additional opening being filled with metal of the first metal layer.

11. The structure of claim 1, wherein the substrate comprises at least one component electrically connected to either the first metal layer through an additional opening of the insulating layer or to a metal region through an opening of the insulating layer.

12. The structure of claim 11, wherein the at least one component is connected to said first metal layer or to said metal region through an interconnection network and a pad.

13. A method of fabricating a structure, the method comprising:

forming an insulating layer above a substrate;

depositing a first metal layer above a first portion of the insulating layer;

forming a first porous region of anodic oxide, above and in contact with the first metal layer; and forming a second porous region of anodic oxide, surrounding the first porous region, in contact with a second portion of the insulating layer adjacent to the first portion of the insulating layer, and in contact with the first metal layer, the second porous region forming an insulating region.

14. The method of claim 13, further comprising depositing a second metal layer above the first metal layer and anodizing the second metal layer to obtain the first and second porous regions.

15. The method of claim 14, further comprising depositing a first hard mask above the second metal layer before anodizing the second metal layer, to obtain a metal region adjacent to the second porous region, the first hard mask partially overlapping at least the second portion of the insulating layer.

16. The method of claim 15, further comprising depositing a second hard mask having an opening above and surrounding the first hard mask, the second hard mask having an opening above the first porous region.

* * * * *